(12) United States Patent
Choi

(10) Patent No.: US 11,956,963 B2
(45) Date of Patent: Apr. 9, 2024

(54) 3-DIMENSIONAL NAND FLASH MEMORY DEVICE, METHOD OF FABRICATING THE SAME, AND METHOD OF DRIVING THE SAME

(71) Applicants: SK hynix Inc., Icheon (KR); SOGANG UNIVERSITY RESEARCH FOUNDATION, Seoul (KR)

(72) Inventor: Woo Young Choi, Seoul (KR)

(73) Assignees: SK hynix Inc., Icheon (KR); SOGANG UNIVERSITY RESEARCH FOUNDATION, Seoul (KR)

(*) Notice: Subject to any disclaimer, the term of this patent is extended or adjusted under 35 U.S.C. 154(b) by 0 days.

(21) Appl. No.: 17/877,118

(22) Filed: Jul. 29, 2022

(65) Prior Publication Data
US 2022/0384481 A1 Dec. 1, 2022

Related U.S. Application Data

(62) Division of application No. 17/203,352, filed on Mar. 16, 2021, now Pat. No. 11,437,401.

(30) Foreign Application Priority Data

Mar. 16, 2020 (KR) .................. 10-2020-0031945

(51) Int. Cl.
*H01L 29/51* (2006.01)
*H01L 21/28* (2006.01)
(Continued)

(52) U.S. Cl.
CPC .......... *H10B 43/27* (2023.02); *H01L 21/3105* (2013.01); *H01L 29/40117* (2019.08);
(Continued)

(58) Field of Classification Search
CPC ... H01L 29/518; H01L 29/517; H01L 29/513; H01L 29/4234; H01L 29/408; H01L 21/3105; H01L 29/40117; H10B 43/27
See application file for complete search history.

(56) References Cited

U.S. PATENT DOCUMENTS 8,797,800 B1 * 8/2014 Dong ................. G11C 16/3427
365/185.11
2003/0235080 A1 * 12/2003 Yaegashi ............ G11C 16/3468
365/185.17
(Continued)

FOREIGN PATENT DOCUMENTS

KR 20110035525 A 4/2011
KR 20110035525 A * 6/2011

*Primary Examiner* — Mohammad M Choudhry

(57) ABSTRACT

A 3-dimensional flash memory device and methods of fabricating and driving the same are provided. The device includes: a channel layer extending over a substrate in a first direction perpendicular to a surface of the substrate; an information storing layer extending along a sidewall of the channel layer in the first direction; control gates each surrounding the channel layer, with the information storing layer between the channel layer and the control gates; an insulating layer being between the control gates in the first direction and separating the control gates from each other; a fixed charge region disposed at an interface of the insulating layer and the information storing layer or in a portion of the information storing layer between the control gates in the first direction; and a doped region induced by the fixed charge region and disposed at a surface of the channel layer facing the fixed charge region.

9 Claims, 15 Drawing Sheets

(51) Int. Cl.
*H01L 21/3105* (2006.01)
*H01L 29/40* (2006.01)
*H01L 29/423* (2006.01)
*H10B 43/27* (2023.01)

(52) U.S. Cl.
CPC ........ *H01L 29/408* (2013.01); *H01L 29/4234* (2013.01); *H01L 29/513* (2013.01); *H01L 29/517* (2013.01); *H01L 29/518* (2013.01)

(56) References Cited

U.S. PATENT DOCUMENTS

| | | | | |
|---|---|---|---|---|
| 2010/0309729 | A1* | 12/2010 | Chang | H10B 43/10 365/185.28 |
| 2012/0120728 | A1* | 5/2012 | Kim | H01L 29/7926 257/315 |
| 2016/0013200 | A1* | 1/2016 | Yamashita | H10B 43/27 257/316 |
| 2019/0267392 | A1* | 8/2019 | Nakatsuka | H01L 29/40117 |

* cited by examiner

3-DIMENSIONAL NAND FLASH MEMORY DEVICE, METHOD OF FABRICATING THE SAME, AND METHOD OF DRIVING THE SAME

CROSS-REFERENCES TO RELATED APPLICATION

The present application is a divisional application of U.S. patent application Ser. No. 17/203,352 filed Mar. 16, 2021 and claims the benefit of Korean patent application number 10-2020-0031945, filed on Mar. 16, 2020, which is herein incorporated by reference in its entirety.

BACKGROUND OF THE INVENTION

1. Field

The present disclosure relates to semiconductor technology, and more particularly, to a 3-dimensional NAND flash memory device and a method of fabricating the same.

2. Description of the Related Art

As the demand for portable digital application devices such as digital cameras, smartphones, and tablet PCs is increasing and conventional hard disks are being replaced with solid-state drives (SSDs), the nonvolatile memory market is rapidly expanding. As the nonvolatile memory device, 3-dimensional NAND flash memory devices which may be highly integrated at low cost has been widely commercialized.

The 3-dimensional NAND flash memory device may include a string selection transistor, a ground selection transistor, and cell transistors disposed therebetween. The cell transistors may share a semiconductor channel and be connected in series with each other. When the number of cell transistors is increased for improving the degree of integration, the resistance of the semiconductor channel is also increased. Thus, there is a problem that a sensing margin for read operation may be reduced. When a size of a detection amplifier is increased to secure the sensing margin, the degree of cell integration may decrease.

Accordingly, in the 3-dimensional NAND flash memory device, it is required to secure a sensing margin to improve the degree of integration, and when a sufficient sensing margin is obtained, a 3-dimensional flash memory device capable of driving at high speed and low power may be provided.

SUMMARY OF THE INVENTION

A technological object to be achieved by the present disclosure is to provide a 3-dimensional NAND flash memory device capable of high-speed and low-power driving while securing a high degree of integration by resolving a decrease in a read current even when the number of memory cells is increased to improve the cell integration.

In addition, another technological object to be achieved by the present disclosure is to provide a method of fabricating a 3-dimensional NAND flash memory device having the above-described advantages.

According to an embodiment of the present invention, 3-dimensional NAND flash memory device may be provided. The 3-dimensional NAND flash memory device may comprise a semiconductor channel layer extending over a substrate in a first direction perpendicular to a surface of the substrate; an information storing layer extending along a sidewall of the semiconductor channel layer in the first direction; control gates each surrounding at least a portion of the semiconductor channel layer, with the information storing layer between the semiconductor channel layer and the control gates; an interlayer insulating layer being disposed between the control gates in the first direction and separating the control gates from each other; a fixed charge region disposed at an interface of the interlayer insulating layer and the information storing layer or in a portion of the information storing layer between the control gates in the first direction; and an electrically doped region which is induced by the fixed charge region, and is disposed at a partial surface of the semiconductor channel layer facing the fixed charge region.

In one embodiment, the fixed charge region disposed at the interface of the interlayer insulating layer and the information storing layer may include a dangling bond of hydrogen molecules formed by a reaction of hydrogen bonding between hydrogen ions (W) and the interlayer insulating layer at the interface. When the interlayer insulating layer may be silicon oxide, the interlayer insulating layer may have a Si—H bond.

In an embodiment, the fixed charge region disposed in the portion of the information storing layer between the control gates may be charged by fixed charges accumulated by a fringing field induced between the control gates and the semiconductor channel layer. The 3-dimensional NAND flash memory device may further include a work function control layer having a work function smaller than that of the control gates on sidewalls of the control gates. A thickness of the interlayer insulating layer may be thicker than a thickness of the control gates. The information storing layer may include a gate insulating layer on the semiconductor channel layer, a data storing layer on the gate insulating layer, and a blocking insulating layer on the data storing layer.

In one embodiment, the data storing layer may include any one selected from the group consisting of $SiO_2$, SiON, $Si_3N_4$, SRN (Si rich nitride), $HfO_2$, HfSiO, HfSiON, HfON, HfAlO, $Al_2O_3$ and AlN or a combination thereof. The charge blocking layer may include any one selected from the group consisting of $SiO_2$, $Si_3N_4$, SiON, $HfO_2$, HfSiO, $Al_2O_3$ and $ZrO_2$ or a combination thereof. The blocking insulating layer may include any one selected from the group consisting of $Al_2O_3$, $SiO_2$, $HfO_2$, $ZrO_2$, $Ta_2O_5$, LaO, LaAlO, LaHfO and HfAlO, or a combination thereof. The semiconductor channel layer may have a cylindrical shape, and a core insulator may be inserted into the semiconductor channel layer to form a semiconductor pillar.

According to another embodiment of the present invention, a method of fabricating a 3-dimensional NAND flash memory device comprising providing a substrate; alternately and repeatedly stacking an insulating layer and a first conductive layer on the substrate; forming first holes spaced apart from each other in a first direction and a second direction, the first and second directions being different from each other and parallel to a surface of the substrate, the first holes penetrating through a stack structure of the insulating layer and the first conductive layer; forming a first fixed charge region on a sidewall of the insulating layer exposed by the first holes; forming an information storing layer along a surface profile of the first holes; and forming a semiconductor channel layer along an exposed surface profile of the information storing layer may be provided.

In an embodiment, the forming of the first fixed charge region may include performing a hydrogen annealing on the sidewall of the insulating layer exposed by the first holes in a hydrogen atmosphere. The forming of the first fixed charge region may include applying plasma damage to the sidewall of the insulating layer exposed by the first holes. The alternately and repeatedly stacking of the insulating layer and the first conductive layer may further include stacking a second conductive layer between the insulating layer and the first conductive layer, the second conductive layer having a work function smaller than that of the first conductive layer.

Another embodiment of the present invention is related to a method of driving a 3-dimensional NAND flash memory, wherein 3-dimensional NAND flash memory comprises a semiconductor channel layer extending over a substrate in a first direction perpendicular to a surface of the substrate, an information storing layer extending along a sidewall of the semiconductor channel layer in the first direction, control gates each surrounding at least a portion of the semiconductor channel layer, the information storing layer being disposed between the semiconductor channel layer and the control gates, an interlayer insulating layer being disposed between the control gates in the first direction and separating the control gates from each other. The method may include forming a first fixed charge region in a portion of the information storing layer under the control gates and a second charge region of the information storing layer between the control gates in the first direction by forming a first electric field between the control gates and the semiconductor channel layer; and eliminating the first fixed charge region formed in the portion of the information storing layer under the control gates by forming a second electric field between the control gates and the semiconductor channel layer, the second electric field having a polarity opposite to that of the first electric field and having a strength smaller than that of the first electric field.

In one example, at least one of the first electric field and the second electric field may be formed by an incremental pulse programming method. The 3-dimensional NAND flash memory device may further include a work function control layer having a work function smaller than that of the control gates on sidewalls of the control gates. A thickness of the interlayer insulating layer may be greater than that of the control gates. The forming of the first and second fixed charge regions and the eliminating of the first fixed charge region may be repeatedly performed at least two or more times.

According to embodiment of the present invention, a 3-dimensional NAND flash memory device includes a fixed charge region formed at an interface of the interlayer insulating layer adjacent to the information storing layer or in a portion of the information storing layer between the control gates; and an electrically doped region which is induced by the fixed charge region, and is formed on a partial surface of the semiconductor channel layer facing the fixed charge region. Therefore, it is possible to improve the reduction in read current. As a result, it is possible to provide a 3-dimensional NAND flash memory device having a high degree of integration, capable of driving at high speed and low power, and having a low occurrence of read errors.

Further, according to another embodiment of the present invention, a method of fabricating a 3-dimensional NAND flash memory device having the above-described advantages is provided.

DETAILED DESCRIPTION OF THE INVENTION

Figure 1:
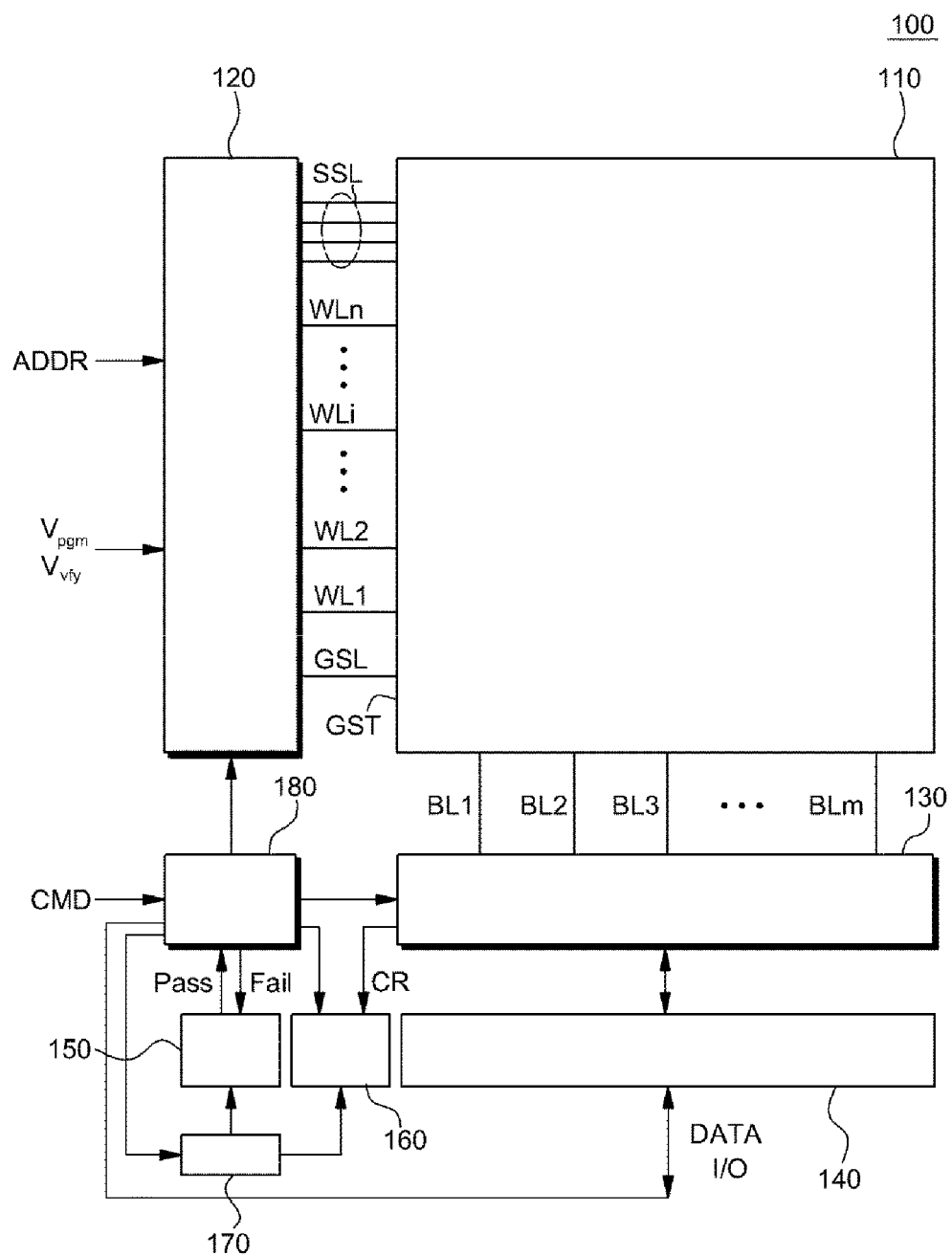
FIG. 1 is a block diagram illustrating a 3-dimensional NAND flash memory device according to an embodiment of the present disclosure.

Hereinafter, the preferred embodiments of the present invention will be described in detail with reference to the accompanying drawings.

The embodiments of the present invention are provided to describe the present invention to those having a common knowledge in the related art, and the following embodiments may be modified in various other forms, and the scope of the present invention is not limited to the following embodiments. Rather, these embodiments are provided to fully convey the spirit of the present invention to those skilled in the art.

The same reference numerals in the drawings refer to the same elements. Further, as used herein, the term, "and/or" includes any one and all combinations of one or more of the listed items.

The terminology used herein is used to describe a specific embodiment and is not intended to limit the present invention. As used herein, a singular form may include plural forms unless the context clearly indicates otherwise. Also, as used herein, the term such as "comprise" and/or "comprising" specifies the mentioned shapes, numbers, steps, actions, members, elements and/or the presence of these groups, and does not exclude the presence or addition of one or more other shapes, numbers, actions, members, elements and/or presence or addition of groups.

Reference to a layer formed "on" a substrate or other layer herein refers to a layer formed directly on the substrate or other layer; or also may refer to an intermediate layer formed on the substrate or other layer, or a layer formed on intermediate layers. Further, for those skilled in the art, a structure or shape arranged "adjacent" to another shape may also have a portion disposed below or overlapping the adjacent shape.

In this specification, as shown on the drawings, the relative terms such as "below", "above", "upper", "lower", "horizontal" or "vertical" may be used to describe the relationship between one component member, one layer, or one region and another component member, another layer, or another region. It is to be understood that these terms encompass not only the orientation indicated in the figures, but also other orientations of the device.

Hereinafter, the embodiments of the present invention will be described with reference to the drawings schematically showing ideal embodiments or an intermediate structure of the present invention. In the drawings, for example, the size and shape of the members may be exaggerated for convenience and clarity of description, and in actual implementation, modifications of the illustrated shape may be expected. Accordingly, embodiments of the present invention should not be construed as limited to the specific shapes of the members or regions shown herein. In addition, reference numerals of members in the drawings refer to the same members throughout the drawings.

FIG. 1 is a block diagram illustrating a 3-dimensional NAND flash memory device 100 according to an embodiment of the present disclosure.

Referring to FIG. 1, the 3-dimensional NAND flash memory device 100 may include a memory cell array 110 of a plurality of memory cells, a row decoder 120, a read/write circuit 130, and a column decoder 140. The memory cell array 110 may be connected to the row decoder 120 through wordlines WL1, WL2, . . . , WLi, . . . , and WLn, selection lines SSL, and ground selection lines GSL. Also, the memory cell array 110 may be connected to the read/write circuit 130 through bitlines BL1, BL2, BL3, . . . , and BLm. i, n and m are positive integers.

In the case of the 3-dimensional NAND flash memory device 100, the memory cell array 110 may include memory cell strings (not shown), each of which includes a plurality of memory cells connected in series. In an embodiment of the present disclosure, a memory cell may include an information storing layer, an interface of adjacent interlayer insulating layers, or a fixed charge region formed in a portion of the information storing layer between control gates. The fixed charge region may generate an electrically doped region induced by a fixed charge of the fixed charge region in a channel layer of a semiconductor. As a result, the electrically doped region may be formed in source/drain regions of the memory cell, thereby reducing the electrical resistance of the entire semiconductor channel, and in particular, a read current is increased during a read operation of the 3-dimensional NAND flash memory device 100. Thus, it is possible to improve a sensing margin, resulting to provide a reliable NAND flash memory device having a high degree of integration, enabling high-speed and low-power driving, and reducing read errors.

At least one or more string selection transistors may be connected to one end of a memory cell string, and a ground selection transistor GST may be connected to the other end of the memory cell string. A common source line may be connected to the other end of the memory cell string, and one end of the ground selection transistor may be electrically connected to the common source line. The wordlines WL1, WL2, . . . , WLi, . . . , and WLn may be connected to control gates of memory cells arranged along a column direction, respectively. The bitlines BL1, BL2, BL3, . . . , and BLm may be connected to one ends of string selection transistors arranged along a row direction, respectively. A plurality of memory cells arranged in the row direction and coupled to each of the wordlines WL1, WL2, . . . , WLi, . . . , and WLn may constitute a logical page, and the number of logical pages may be determined by the storage capacity of the memory cell.

In the 3-dimensional NAND flash memory device 100 according to the embodiment, the row decoder 120 may select one of the wordlines WL1, WL2, . . . , WLi, . . . , and WLn of a memory block, and the column decoder 140 may select one of the bitlines BL1, BL2, BL3, . . . , and BLm). The read/write circuit 130 may receive data transmitted from an external circuit through the column decoder 140 or output data read out of the memory cell array 110 to the external circuit, may include page buffers (not shown) corresponding to the bitlines BL1, BL2, BL3, . . . , and BLm, and may operate as a sense amplifier or a write driver according to an operation mode.

The 3-dimensional NAND flash memory device 100 may further include one or more of a control logic 180, a pass/fail detector 150, a program loop sequence detector 160, and a comparator 170. The control logic 180 may control the row decoder 120, the read/write circuit 130, the column decoder 140, the pass/fail detector 150, the program loop sequence detector 160, and/or the comparator 170 to perform a pulse program and verification operation based on an incremental step pulse programming (ISPP) method according to a command CMD. In various designs, the control logic 180 may be integrated with the memory cell array 110 in the same chip or may be disposed on a different chip from the memory cell array 110. For example, like a case of a solid state drive (SSD), the control logic 180 may be provided in a flash translation layer (FTL) that is another chip separated from the memory cell array 110.

Further, although, in FIG. 1, the above-described pass/fail detector 150, the program loop sequence detector 160, and the comparator 170 are illustrated to be formed separately from the control logic 180, embodiments are not limited thereto. For example, at least one of the pass/fail detector 150, the program loop sequence detector 160, and the comparator 170 may be implemented in a software and/or a hardware in the control logic 180. In addition, at least one of the pass/fail detector 150, the program loop sequence detector 160, and the comparator 170 may be omitted or another circuit configuration may be added to them.

Figure 2:
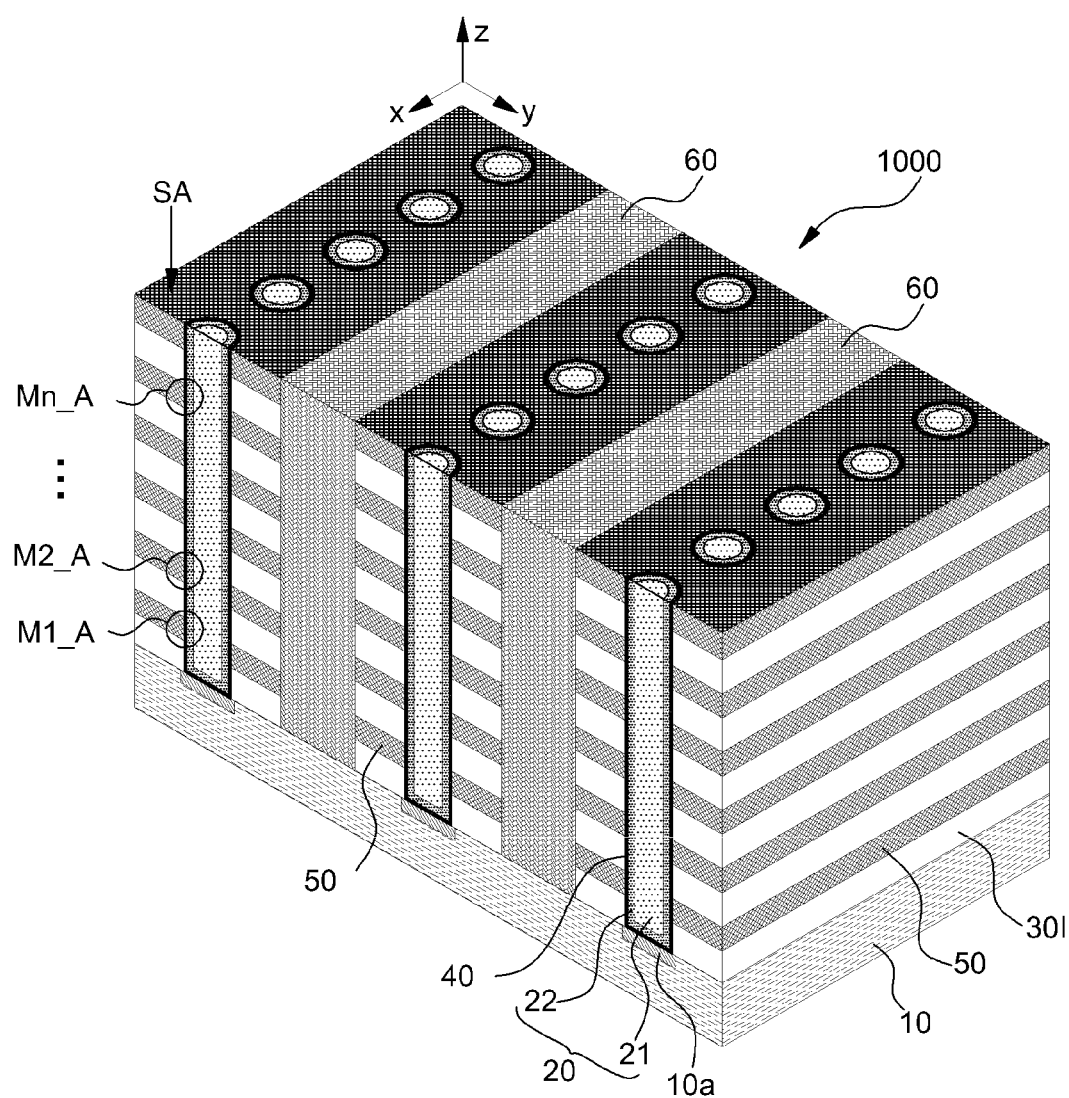
FIG. 2 is a perspective view illustrating a 3-dimensional NAND flash memory device including memory cells according to an embodiment of the present disclosure.
Figure 3A:
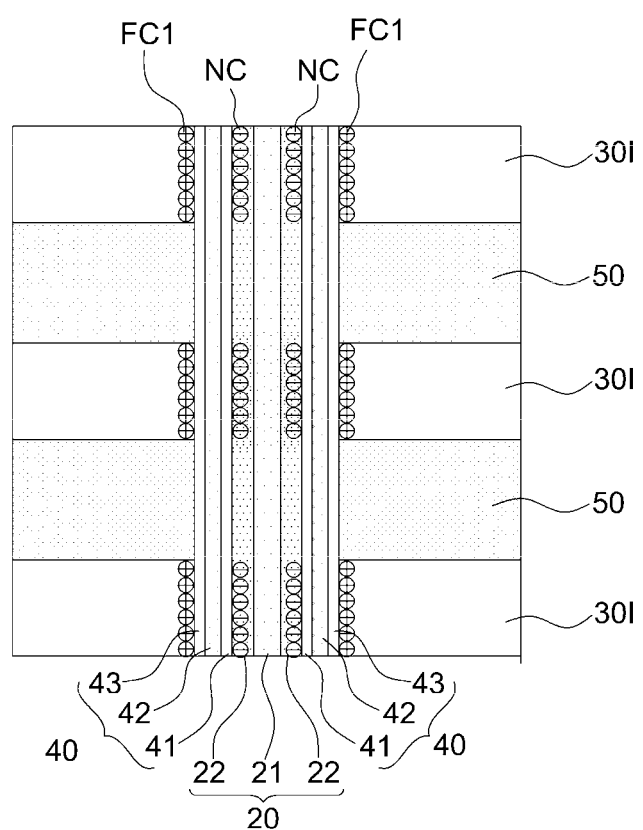
FIGS. 3A to 3C are enlarged cross-sectional views illustrating structures of memory cell areas indicated by a dotted circle in FIG. 2 according to various embodiments of the present disclosure.
Figure 3B:
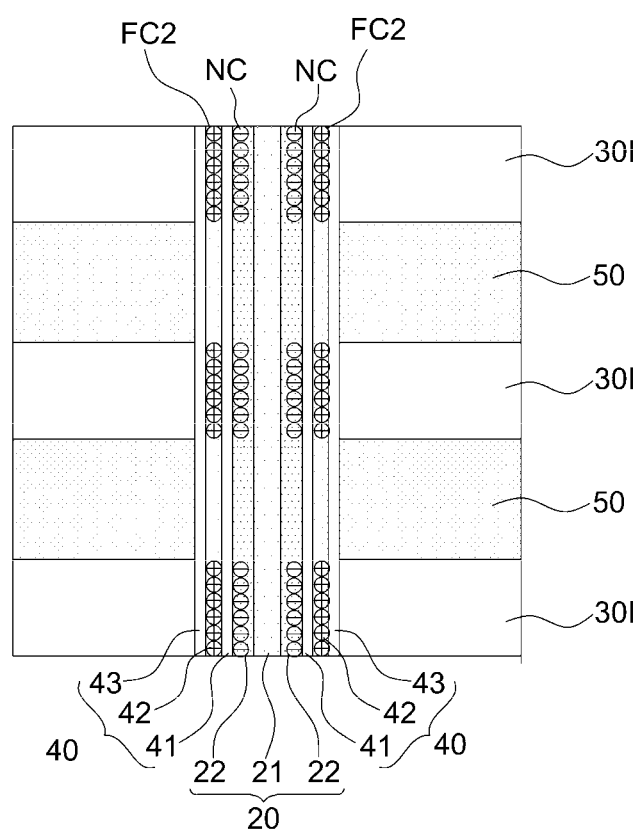
Figure 3C:
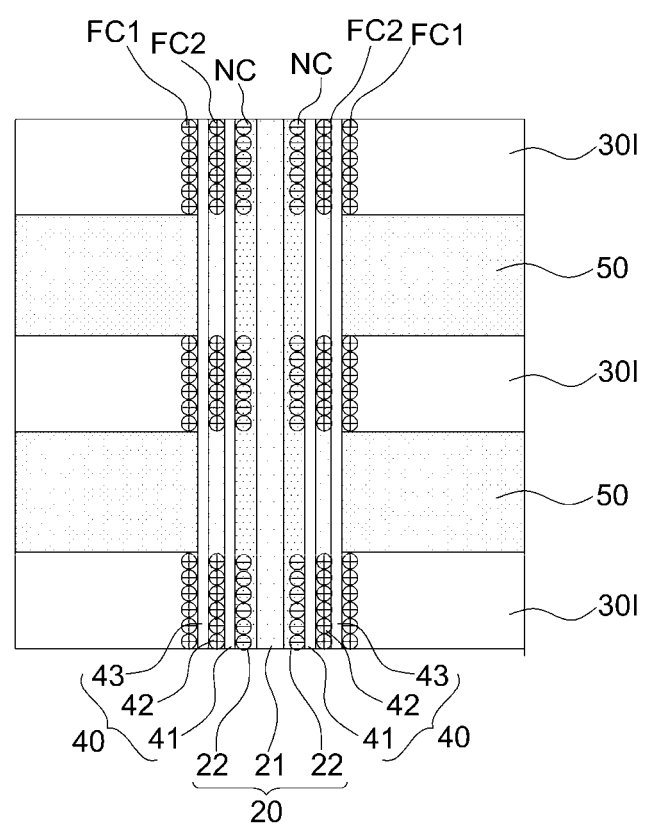

FIG. 2 is a perspective view illustrating a 3-dimensional NAND flash memory device 1000 including a plurality of memory cells M1_A, M2_A, . . . , and Mn_A according to an embodiment of the present disclosure, and FIGS. 3A to 3C are enlarged cross-sectional views illustrating a structure of a memory cell area indicated by a dotted circle in FIG. 2 according to various embodiments of the present disclosure.

Referring to FIG. 2, the 3-dimensional NAND flash memory device 1000 may include the plurality of three-dimensional memory cells M1_A, M2_A, . . . , and Mn_A which may be aligned in an x direction parallel to a substrate 10 (hereinafter, referred to as a first direction), a y direction different from the x direction (hereinafter, referred to as a second direction), and a z direction perpendicular to the substrate 10 (hereinafter, referred to as a vertical direction). In some embodiments, the first direction (x direction) and the second direction (y direction) may be orthogonal to each other.

The substrate 10 may be a semiconductor substrate such as a Si single crystal substrate, a compound semiconductor substrate, a silicon on insulator (SOI) substrate, a strained substrate, or the like. In an embodiment, a semiconductor layer may be provided in a peripheral circuit region defined below a 3-dimensional NAND flash memory cell, and the semiconductor layer itself may be a substrate. The embodiments of the present disclosure are not limited thereto, and for example, in other embodiments, the substrate 10 may be a ceramic substrate or a polymer substrate for implementing a flexible device, or even a fabric layer. An impurity region 10a formed by doping impurity ions into the substrate 10, or a wiring such as a conductive layer (not shown) may be provided in or on the substrate 10. The impurity region 10a may be the aforementioned common source line to which one end of the memory string is coupled.

A semiconductor pillar 20 for providing channels to the plurality of memory cells M1_A, M2_A, and Mn_A may be formed on the substrate 10 in the vertical direction (z direction). The semiconductor pillar 20 may include a core insulator 21 extending in the vertical direction (z direction) and a semiconductor channel layer 22 formed on the core insulator 21. The semiconductor channel layer 22 may have a cylindrical shape to surround the core insulator 21.

A plurality of semiconductor pillars 20 may be arranged spaced apart from each other in the first direction (x direction) and the second direction (y direction) on the substrate 10. Device insulation layers 60 may be provided for isolating the semiconductor pillars 20 in the second direction (y direction). The device insulation layers 60 may extend in the first direction (x direction) and the third direction (z direction), and may be spaced apart from each other in the second direction (y direction).

In memory cells stacked in the vertical direction (z direction) of each memory string, the memory cells may be separated with each other by an interlayer insulating layer 30I. In the embodiment shown in FIG. 2, a selection transistor and/or a ground selection transistor coupled to the memory string are omitted for convenience of explanation, and well-known techniques may be referred to. Memory cells in a memory string may have a NAND flash memory structure in which the memory cells are connected in series. The memory cells of the memory string may be formed by any number, for example, 32, 48, 64, 72, 96, or 128, which may be appropriately selected in consideration of the required memory capacity, yield, and/or total resistance connected in series, but embodiments are not limited thereto.

Referring to FIG. 2, each memory cell may include the semiconductor channel layer 22 vertically extending on the substrate 10, an information storing layer 40 vertically extending along sidewalls of the semiconductor channel layer 22, a control gate 50 surrounding at least a portion of the semiconductor channel layer 22 while arranging the information storing layer 40 between the semiconductor channel layer 22 and the control gate 50, and an interlayer insulating layer 30I separating the control gate 50 from another control gate.

Along with FIG. 2, referring to FIGS. 3A to 3C, the information storing layer 40 may include a gate insulating layer 41, a charge trapping layer (or a data storing layer) 42, and a blocking insulating layer 43 on the semiconductor channel layer 22, but embodiments are not limited there. Other well-known multilayer structures may be applied to the information storing layer 40. The information storing layer 40 may be formed along the semiconductor pillar 20 in the vertical direction of the substrate 10 and may extend continuously between memory cells.

In one embodiment, the gate insulating layer 41 may include any one selected from the group consisting of $SiO_2$, $Si_3N_4$, SiON, $HfO_2$, HfSiO, $Al_2O_3$, $ZrO_2$, and a combination thereof. The data storing layer 42 may include a dielectric matrix and silicon nanocrystals NC dispersed in the dielectric matrix. The dielectric matrix may include at least one dielectric material selected from the group consisting of $SiO_2$, SiON, $Si_3N_4$, SRN (Si rich nitride), $HfO_2$, HfSiO, HfSiON, HfON, HfAlO, $Al_2O_3$, and AN. The blocking insulating layer 43 may include any one selected from the group consisting of $Al_2O_3$, $SiO_2$, $HfO_2$, $ZrO_2$, $Ta_2O_5$, LaO, LaAlO, LaHfO, HfAlO, and a combination thereof.

The above-described materials for the dielectric matrix of the data storing layer 42, the gate insulating layer 41, and the blocking insulating layer 43 are exemplary, and other well-known materials may be employed. For example, according to a stacking sequence of a gate electrode—a gate insulating layer—a data storing layer—a blocking insulating layer—a substrate, the information storing layer 40 may have a laminated structure of various materials such as SONOS (polysilicon-silicon dioxide-silicon nitride-silicon dioxide-Silicon), SANOS(polysilicon-alumina-silicon nitride-silicon dioxide-Silicon), TANOS(Tantalum or titanium nitride-alumina-silicon nitride-silicon dioxide-Silicon), MANOS (metal-alumina-silicon nitride-silicon dioxide-Silicon), or Be-MANOS(metal-alumina-silicon nitride-Band engineered oxide-Silicon). However, each of the materials of the information storing layer 40 is exemplary, and other candidate materials may be applied.

In an embodiment, the control gate 50 may be formed of a conductive layer, and the control gate 50 may be a wordline (hereinafter, collectively referred to as the control gate) of a memory cell. As described above, a lower end of the semiconductor pillar 20 may be coupled to, for example, the common source line 10a, and a bitline (not shown) may be coupled to an upper end of the semiconductor pillar 20. A string selection transistor may be provided between the bitline and the wordline of the uppermost memory cell in a memory string. Wordlines provided by stacked electrode layers, i.e., control gates 50 that are stacked in the vertical direction, may be patterned as a step shape, and a bias may be independently applied to the selected wordline through a contact plug (not shown) contacting the selected wordline.

Referring back to FIGS. 3A to 3C, fixed charge regions FC1 and FC2 may be formed between the neighboring control gates 50 in the vertical direction, that is, between neighboring memory cells in the vertical direction. An electrically doped region NC may be formed on a surface of the semiconductor channel layer 22 overlapped with the fixed charge regions FC1 and FC2. In an embodiment, the electrically doped region NC may function as an n-type region or a p-type region for source/drain regions of memory cells according to a charge type of the fixed charge regions FC1 and FC2. In the illustrated embodiment, an n-type region formed by electrical doping of electrons is illustrated.

In the case of FIG. 3A, the fixed charge region FC1 may be formed at an interface between the information storing layer 40 and the interlayer insulating layer 30I adjacent to the information storing layer 40. The electrically doped region NC may be induced by the fixed charge region FC1, and may be formed on a partial surface of the semiconductor channel layer 22 facing the fixed charge region FC1. In one embodiment, the fixed charge region FC1 formed at the interface of the interlayer insulating layer 30I adjacent to the information storing layer 40 may be a positive charge region due to Si—H bonds generated from defects of hydrogen molecules formed by the hydrogen bonding reaction at the interface between hydrogen ion ($H^+$) provided in a gas phase and the interlayer insulating layer 30I during a fabricating process of FIG. 5A to be described later. In another embodiment, the fixed charge region FC1 may be a damaged layer on the surface of the interlayer insulating layer 30I exposed to a plasma environment for dry etching.

In the case of FIG. 3B, the fixed charge region FC2 may be formed in the information storing layer 40 between the control gates 50 stacked in the vertical direction. The electrically doped region NC may be induced by the fixed charge region FC2, and may be formed on a portion of the surface of the semiconductor channel layer 22. In one embodiment, the fixed charge region FC2 may be positive or negative charges which may be intentionally accumulated by a fringing effect on an electric field induced in the gate electrode, i.e., the control gate 50. In FIG. 3B, the fixed charge region FC2 having a positive charge is illustrated.

Since the fixed charge region FC2 formed in the information storing layer 40, as shown in FIG. 3B, is more adjacent to the semiconductor channel layer 22 than the fixed charge region FC1 formed in the interlayer insulating layer 30I, as shown in FIG. 3A, even if the charge density of the fixed charge region FC1 is the same as that of the fixed charge region FC2, the electrically doped region NC may be formed to have a higher charge density on the surface of the semiconductor channel layer 22 in case of the fixed charge regions FC2 than in case of the fixed charge regions FC1. This means that during a read operation to which the same voltage is applied, the fixed charge region FC2 formed in the information storing layer 40 may further improve a read current passing through a semiconductor channel than the fixed charge region FC1 formed in the interlayer insulating layer 30I.

Referring to FIG. 3C, a NAND flash memory device may include both of the fixed charge regions FC1 formed in the interlayer insulating layer 30I and the fixed charge regions FC2 formed in the information storing layer 40. The two types of fixed charge regions FC1 and FC2 may simultaneously induce the electrically doped region NC on the surface of the semiconductor channel layer 22 overlapped with the fixed charge regions FC1 and FC2.

Figure 4A:
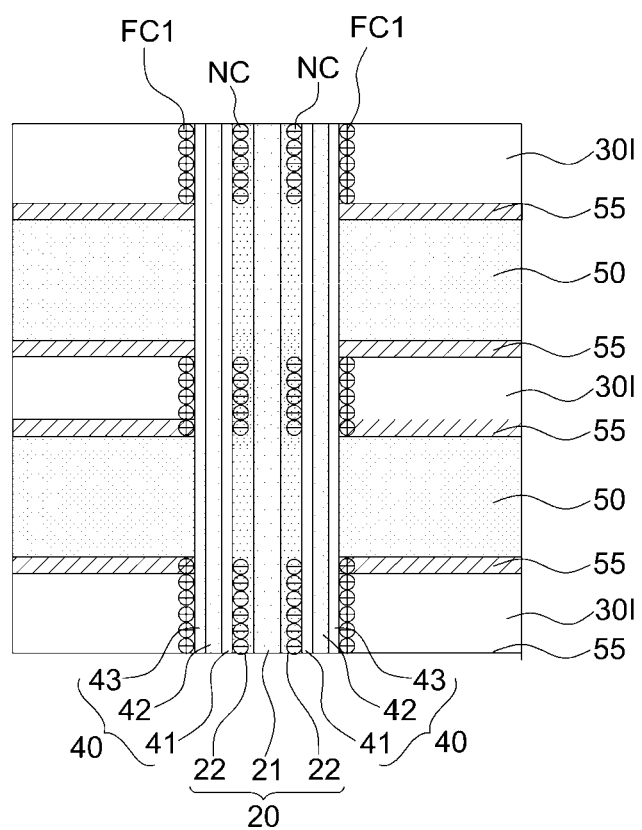
FIG. 4A to FIG. 4C are cross-sectional views illustrating memory cells according to various embodiments of the present disclosure.
Figure 4B:
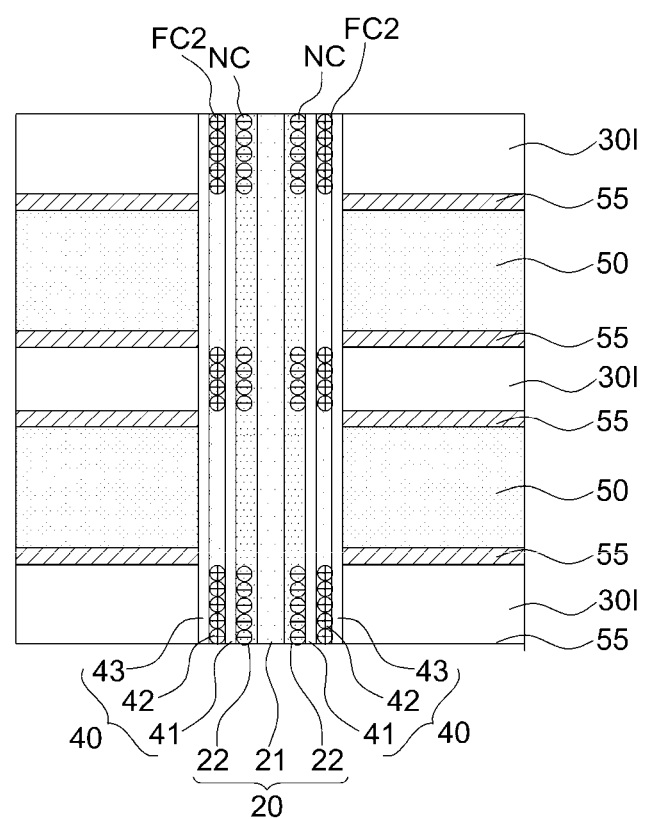
Figure 4C:
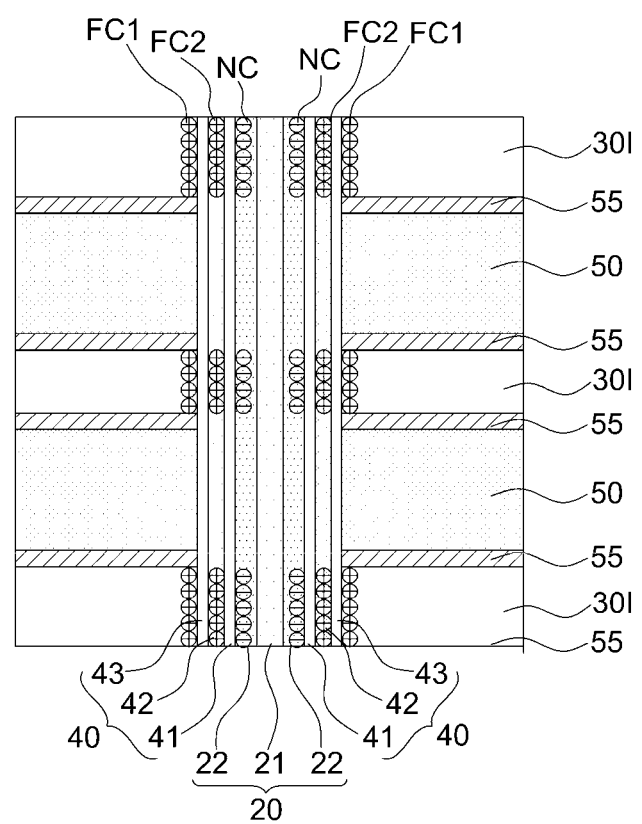

FIG. 4A to FIG. 4C are cross-sectional views illustrating memory cells according to various embodiments of the present disclosure.

Referring to FIG. 4A to FIG. 4C, the control gate 50 may further include a work function control layer 55 on sidewalls of the control gate 50. The work function control layer 55 may be a layer having a work function smaller than that of the control gate 50. Fringing fields (fringing effect) diverged from the neighboring control gates 50 toward a space between the neighboring control gates 50 are required during an operation to form a fixed charge region. The work function control layer 55 may further diffuse the fringing fields diverged from the neighboring control gates 50 toward a space between the neighboring control gates 50 and thus, the fixed charge regions FC1 and FC2 may be formed more easily at the interface of the interlayer transition layer 30I or in the information storing layer 40 between the control gates 50, respectively.

In one embodiment, since the electric field formed by the fringing effect may act as interference to adjacent memory cells, the work function control layer 55 may be disposed when the interlayer insulating layer 30I is thicker than the control gate 55 so that the interlayer insulating layer 30I may secure the inter-cell interference margin.

FIG. 5A to FIG. 5G are cross-sectional views sequentially illustrating a method of fabricating a 3-dimensional NAND flash memory device according to an embodiment of the present disclosure.

Figure 5A:
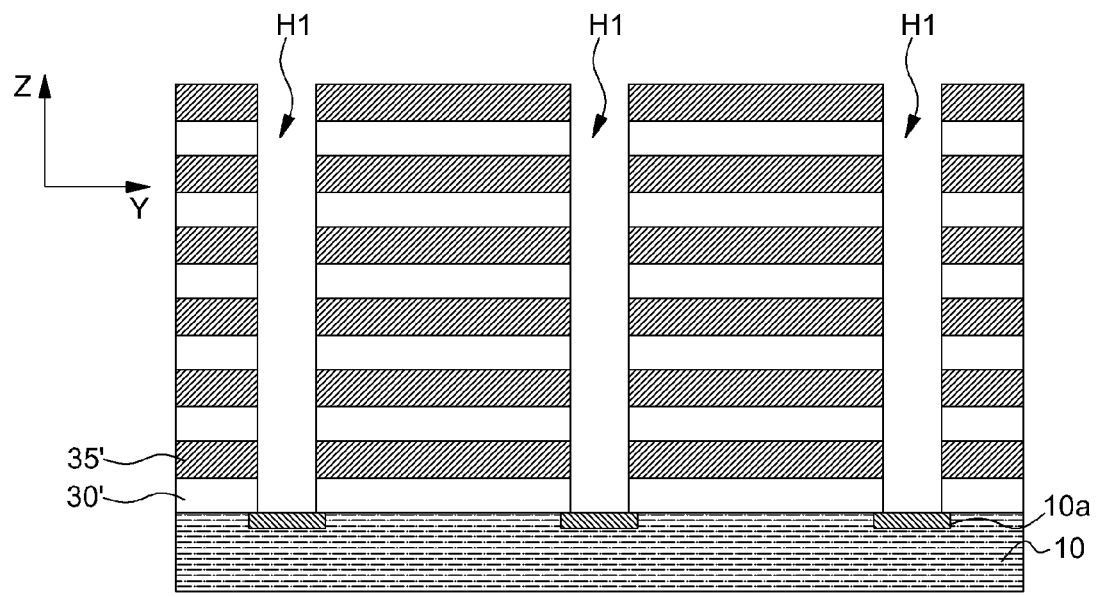
FIG. 5A to FIG. 5G are cross-sectional views sequentially illustrating a method of fabricating a 3-dimensional NAND flash memory device according to an embodiment of the present disclosure.

Referring to FIG. 5A, a substrate 10 may be provided. An impurity region or a conductive member 10a such as a wiring may be formed in a part of an upper portion of or on the substrate 10. This is exemplary, and the conductive member 10a may be a connection member for obtaining one end of a switching element, a contact, or a string structure such as a Piped-Bics structure. After that, an insulating layer 30' and a first conductive layer 35' may be alternately stacked on the substrate 10 including the conductive member 10a. The stacking number of the insulating layer 30' and the first conductive layer 35' may be determined in consideration of the number of memory cells, selection transistors, and ground selection transistors included in a memory string.

In one embodiment, the first conductive layer 35' may include a conductive metal or a conductive metal oxide or nitride. Thereafter, first holes H1 penetrating through a stack of the insulating layer 30' and the first conductive layer 35' repeatedly stacked in the vertical direction may be formed. The conductive layer 35' may have a high-concentration impurity polysilicon, aluminum, tungsten, or titanium nitride layer, or a stacked structure of two or more thereof, but embodiments are not limited thereto.

In another embodiment, as described with reference to FIGS. 4A to 4C, an additional conductive layer to be the work function control layer 55 may be further formed between the insulating layer 30' and the first conductive layer 35'. In this case, the work function of the additionally formed conductive layer may be smaller than that of the first conductive layer 35' as described above.

Figure 5B:
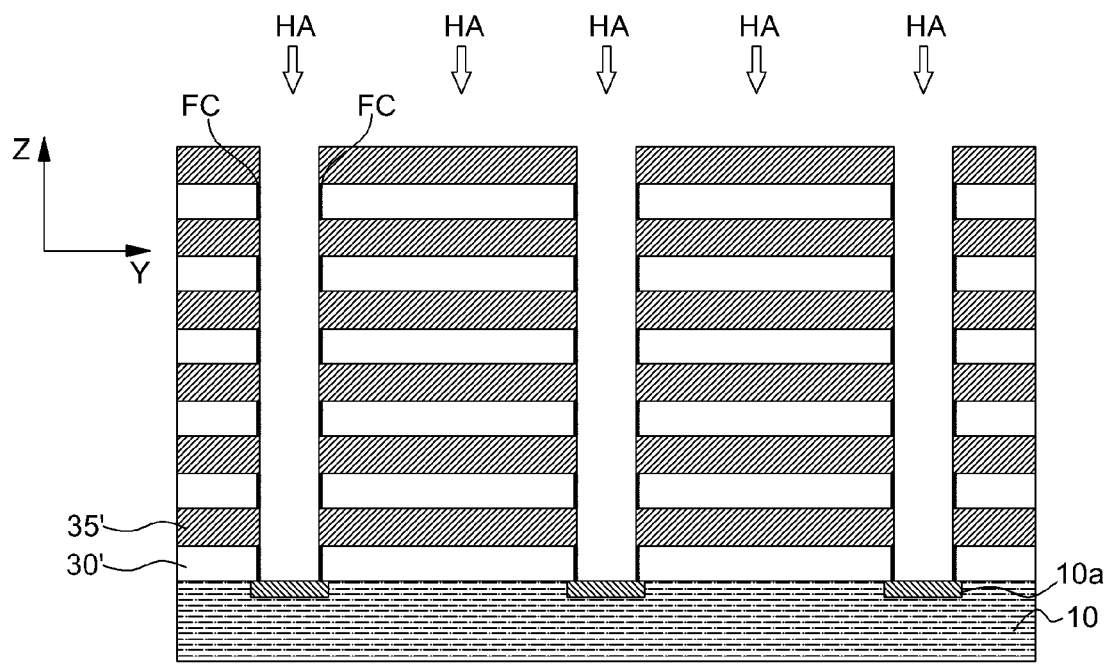

Referring to FIG. 5B, a fixed charge region FC may be selectively formed on a sidewall of the insulating layer 30' exposed by the first holes H1 through hydrogen annealing (HA) in a hydrogen atmosphere. The hydrogen annealing in the hydrogen atmosphere may be performed in a temperature range of 150° C. to 700° C. The temperature of the hydrogen annealing may be appropriately selected to form a defect such as a dangling bond in the Si—H bond while inducing a reaction between hydrogen ions (H+) and Si to form the Si—H bond.

Figure 5C:
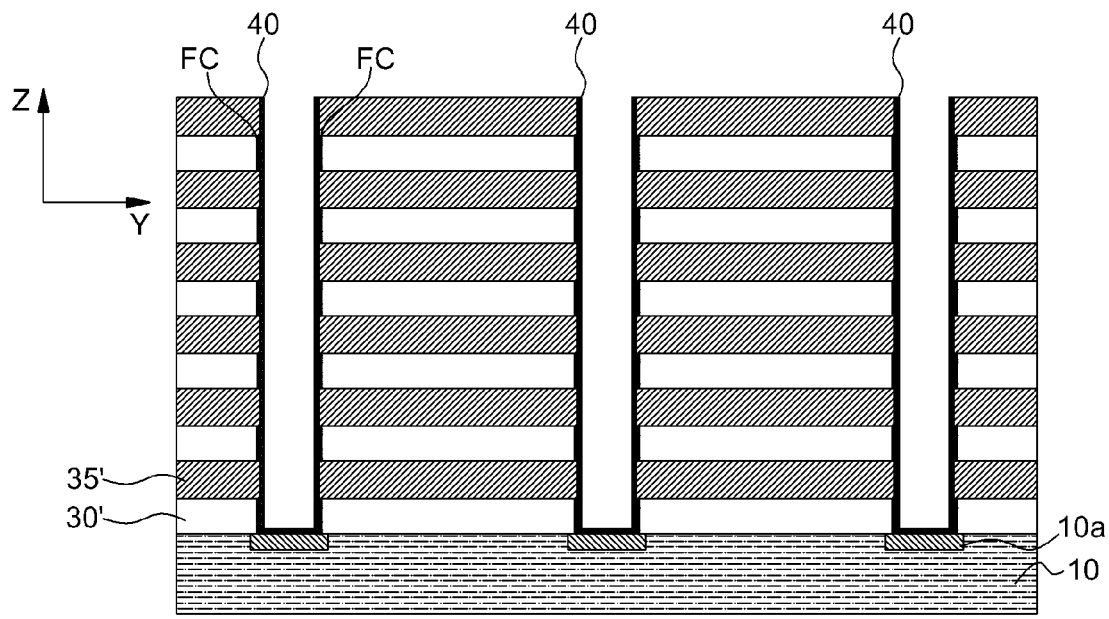

Referring to FIG. 5C, an information storing layer 40 may be formed on inner sidewalls of the holes H1 penetrating through the stack of the first insulating layer 30' having the fixed charge region FC and the first conductive layer 35'. That is, the information storing layer 40 may be formed along a surface profile of the holes H1. The information storing layer 40 may be formed through a thin layer formation process having excellent step coverage, for example, a chemical vapor deposition or atomic layer deposition process. The information storing layer 40 may include a gate insulating layer, a data storing layer, and a blocking insulating layer described with reference to FIGS. 3A to 3C. However, this is only exemplary, and embodiments are not limited thereto. In one embodiment, when the data storing layer 42 of silicon nitride is deposited, silicon nanocrystals may be formed in situ in the matrix of silicon nitride through a plasma enhanced chemical vapor deposition (PECVD), thereby forming the data storing layer 42 in which silicon nanocrystal grains are dispersed in a dielectric. The silicon nanocrystal grains in the data storing layer 42 may provide a multi-level bit mechanism by forming a plurality of levels of deep trap levels.

Figure 5D:
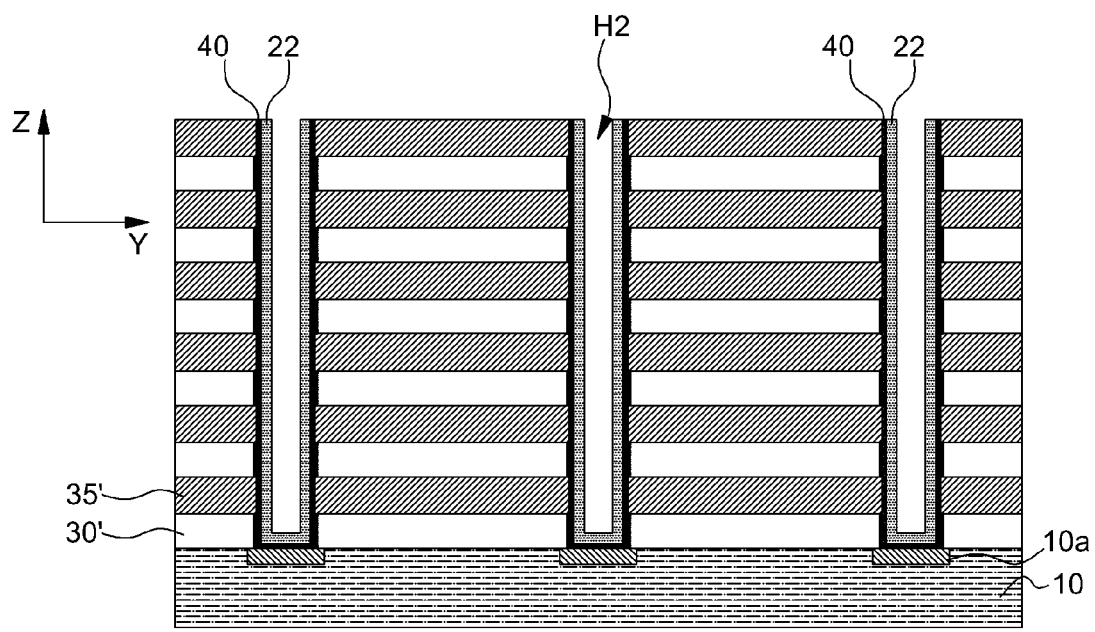

Referring to FIG. 5D, a semiconductor channel layer 22 may be formed along a sidewall of the information storing layer 40 so that second holes H2 remain in the first holes H1. For example, the semiconductor channel layer 22 may be formed along an exposed surface profile of the information storing layer 40. For example, the semiconductor channel layer 22 may be formed by stacking a thin layer in an unit of atomic layer. To this end, the semiconductor channel layer 22 may be formed through layer-by-layer deposition by an atomic layer deposition method.

Figure 5E:
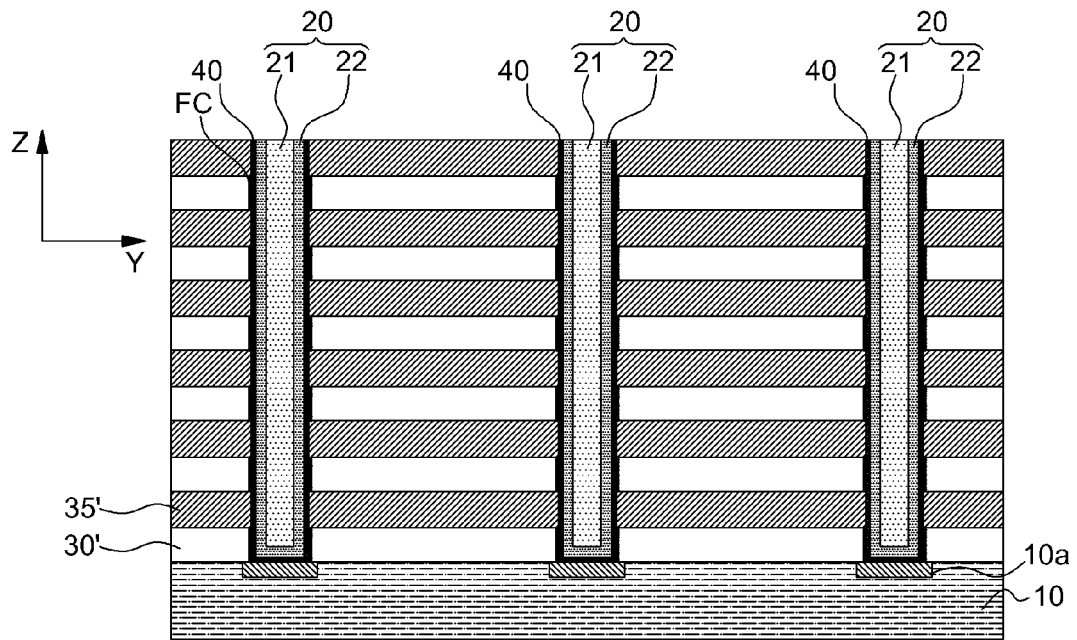

Referring to FIG. 5E, a core insulator 21 filling the second holes H2 may be formed on the semiconductor channel layer 22. Accordingly, a semiconductor pillar 20 including the core insulator 21 and the semiconductor channel layer 22 may be provided. The bottom of the semiconductor channel layer 22 may be formed to contact the substrate 10, and the semiconductor channel layer 22 may be electrically connected to a source line, i.e., the conductive member 10a formed in the substrate 10.

Figure 5F:
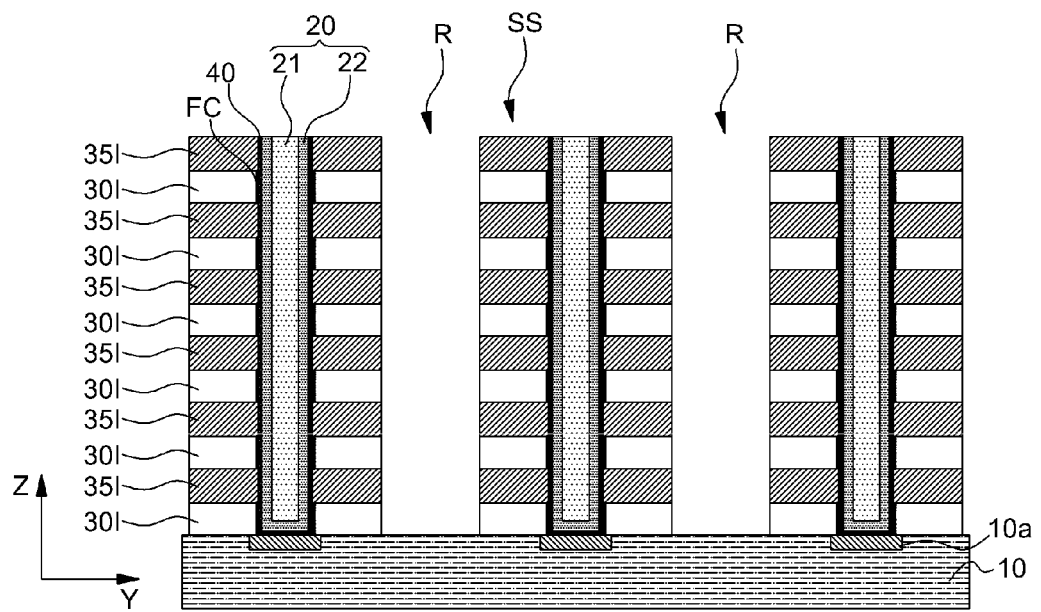

Referring to FIG. 5F, in connection with the substrate 10 on which the semiconductor pillars 20 are formed, a trench region R, which extends in the first direction (x direction) and the vertical direction (z direction) in the stacked structure of the insulating layer 30' and the first conductive layer 35', is formed, and a plurality of trench regions R may be formed to be spaced apart in the second direction (y direction). As a result, stacked structures SS, each of which includes an insulating layer pattern 30I and a conductive layer pattern 35I that are alternately stacked and surround semiconductor pillars 20 arranged in the first direction as shown in FIG. 2, may be formed to be separated from each other by the trench region R1.

Figure 5G:
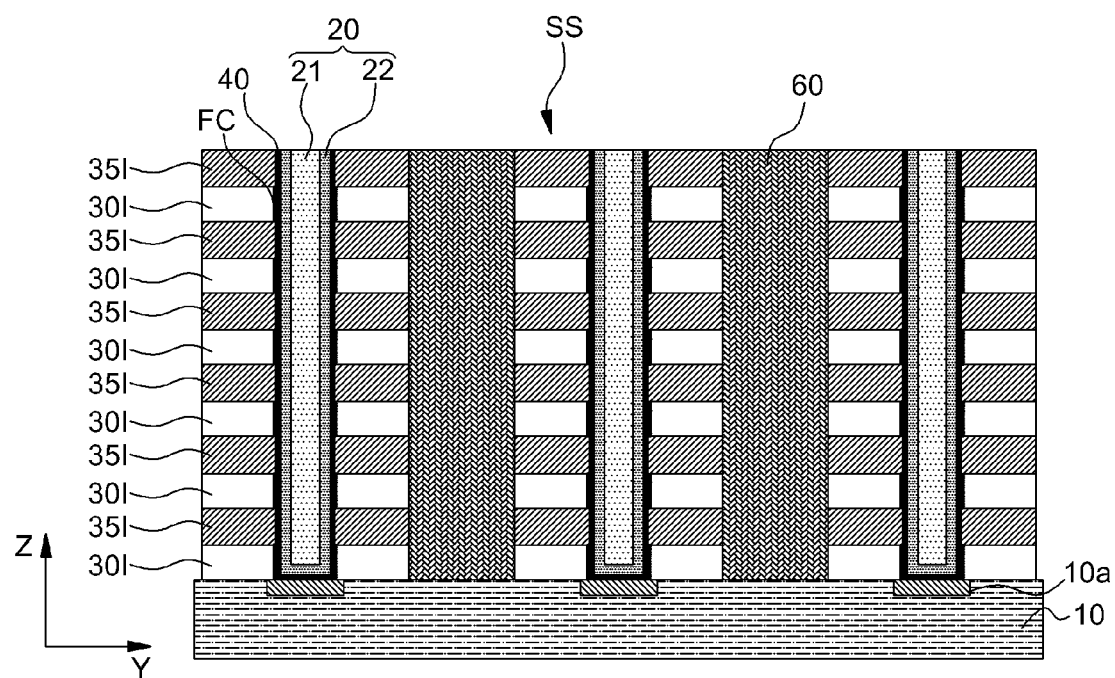

Referring to FIG. 5G, a device isolation insulating layer 60 may be formed by filling the trench region R. The device isolation between memory strings adjacent to each other in the second direction (y direction) may be realized by the device isolation insulating layer 60.

According to the above-described embodiments, the 3-dimensional NAND flash memory device may be provided, the 3-dimensional NAND flash memory device comprising the fixed charge region formed at the interface of the interlayer insulating layer adjacent to the information storing layer or in a portion of the information storing layer between the control gates; and an electrically doped region which may be induced by the fixed charge region, wherein the electrically doped region may be formed on a partial surface of the semiconductor channel layer facing the fixed charge region. The resistance of the semiconductor channel layer between adjacent memory cells may be reduced by the electrically doped regions, thereby improving the read current of the 3-dimensional NAND flash memory device. In addition, by improving the read current, high-speed and low-power driving of the 3-dimensional NAND flash memory device may be realized while improving the degree of integration. In addition, a reliable nonvolatile memory device in which the occurrence of read errors may be suppressed may be provided.

Figure 6A:
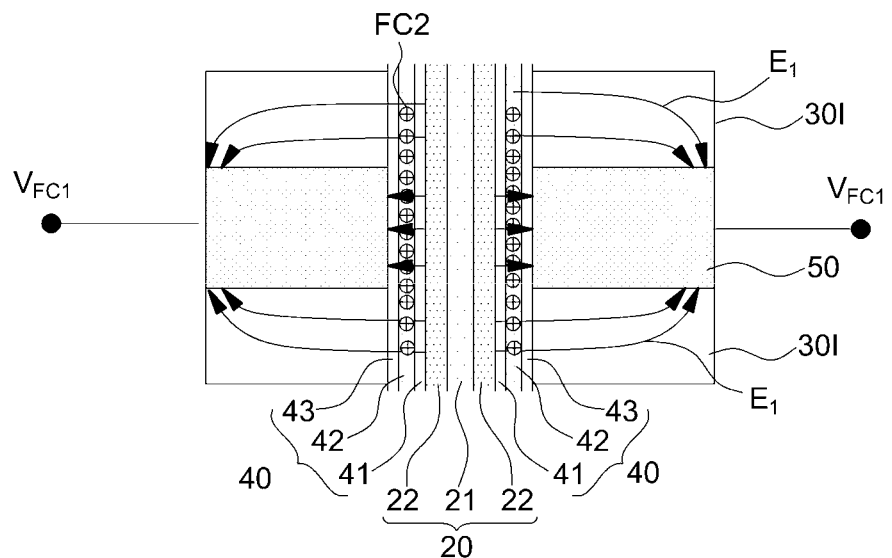
FIG. 6A and FIG. 6B are diagrams for explaining a driving method of forming a fixed charge region in a portion of an information storing layer according to an embodiment of the present disclosure.
Figure 6B:
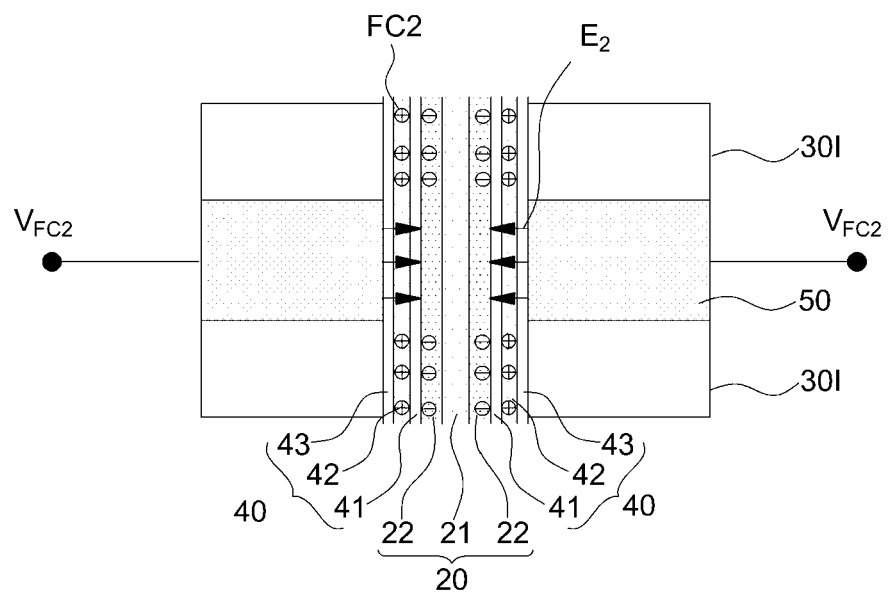

FIG. 6A and FIG. 6B are diagrams for explaining a driving method of forming a fixed charge region in a portion of an information storing layer according to an embodiment of the present disclosure.

Referring to FIG. 6A, when a strong first electric field $E_1$ is formed between the control gate 50 of the memory cells and the semiconductor channel layer 22, fixed charges FC1 may be formed not only in a portion of the information storing layer 40 under the control gate 50 in a direction parallel to a plane formed in the first and second directions, but also in a portion of the information storing layer 40 between the control gates 50 in the vertical direction. FIGS. 6A and 6B illustrate the case where the fixed charges FC1 are positive charges. The strong first electric field $E_1$ has a fringing field which diffuses from the sidewall of the gate electrode, i.e., the control gate 50, to a space between the neighboring control gates 50. As a result, the fixed charges FC1 may be formed in a portion of the information storing layer 40 between the control gates 50. In one embodiment, a first driving voltage ($V_{FC1}$), for example, a negative voltage of −15 V, may be applied to the control gates 50 to form the strong first electric field $E_1$, and the semiconductor channel layer 20 may be grounded. Conversely, the control gates 50 may be grounded and the first driving voltage ($V_{FC1}$), for example, the positive voltage of 15 V, may be applied to the semiconductor channel layer 20 to form the strong first electric field $E_1$.

The step for forming the fixed charges FC1 by forming the first electric field $E_1$ may be performed multiple times. In an embodiment, the first electric field $E_1$ may be performed by an incremental step pulse programming (ISP) method until sufficient fixed charges FC1 are developed like in a program operation.

Referring to FIG. 6B, thereafter, a second electric field $E_2$ having a smaller strength than the first electric field $E_1$ and having a direction opposite to the direction of the first electric field $E_1$ may be formed between the control gates 50 of the memory cells and the semiconductor channel layer 22. For example, a second driving voltage ($V_{FC2}$), which has polarity opposite to polarity of the first driving voltage ($V_{FC1}$) and has smaller amplitude than that of the first driving voltage ($V_{FC1}$), may be applied to the control gate 50. For example, a positive voltage of 10 V may be applied to the control gate 50. As the fringing field emanating from the sidewall of the control gate 50 is reduced, the electric force acting on the fixed charges FC2 formed in the portion of the information storing layer 40 between the control gates 50 may be reduced, and thus the corresponding fixed charges FC2 may not be affected. However, since the second driving voltage ($V_{FC2}$) forms the second electric field $E_2$ concentrated at the bottom of the control gate 50 and in the semiconductor channel layer 22, the fixed charges FC2 formed on the portion of the information storing layer 40 under the control gate 50 may be eliminated. As a result, the fixed charges FC2 remain only in the portion of the information storing layer 40 between the control gates 50 due to the second driving voltage ($V_{FC2}$). Accordingly, as the charges of opposite polarities are electrically doped in the source/drain regions of the semiconductor channel layer 22 by the fixed charges FC2, the total resistance of the semiconductor channel layer 22 may be reduced during a read operation.

Although the above-described embodiment exemplifies the case where the second driving voltage ($V_{FC2}$) is applied to the control gate 50 and the semiconductor channel layer 22 is grounded, but the second driving voltage ($V_{FC2}$) may be applied to the semiconductor channel layer 22, and the control gate 50 may be grounded. In this case, the second driving voltage ($V_{FC2}$) may have, for example, a negative voltage, for example, −10 V.

In an embodiment, a step for forming the second electric field $E_2$ to erase the fixed charges FC2 formed on the portion of the information storing layer 40 under the control gate 50 may be performed multiple times. In an embodiment, the second electric field $E_2$ may be performed by the incremental step pulse programming (ISP) method until a fixed charge is sufficiently erased like in a program operation.

The steps illustrated in FIGS. 6A and 6B may be repeatedly performed. In addition, these steps may be performed as an initialization process of a memory device, or they may be performed regularly or irregularly as necessary to prevent a decrease of a size of a read current during an actual read or program operation.

Figure 7A:
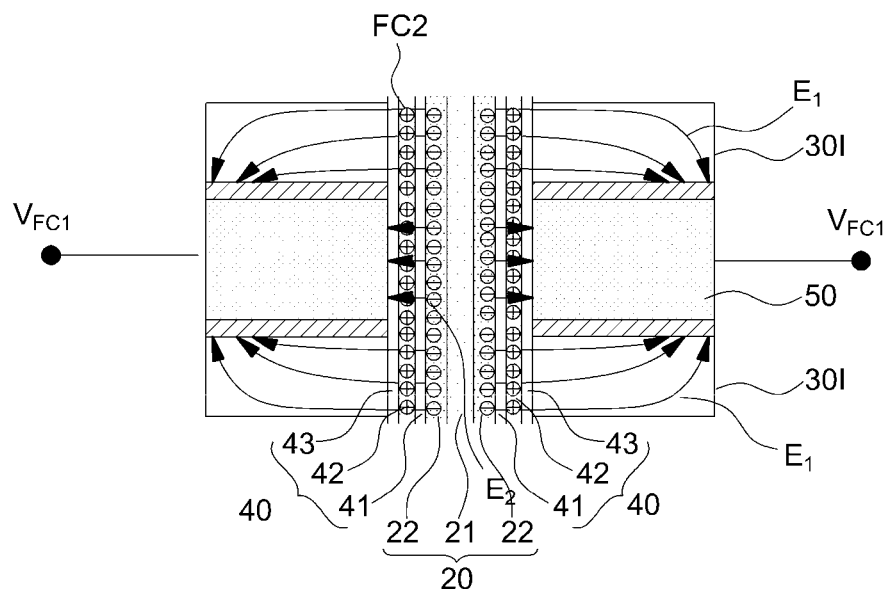
FIG. 7A and FIG. 7B are diagrams for describing a driving method of forming a fixed charge region in a portion of an information storing layer according to an embodiment of the present disclosure.
Figure 7B:
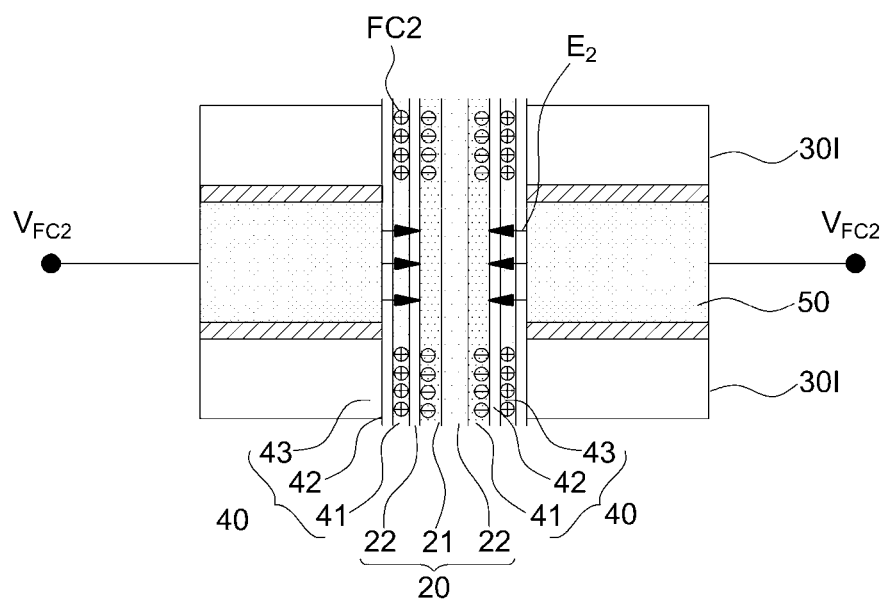

FIG. 7A and FIG. 7B are diagrams for describing a driving method of forming a fixed charge region in a portion of an information storing layer according to an embodiment of the present disclosure. FIG. 7A and FIG. 7B are similar to the driving method of FIGS. 6A and 6B described above, and the description for FIGS. 6A and 6B may be referred to if there are no contradiction. FIGS. 7A and 7B show a memory cell including the work function control layer 55 that is formed between the control gate 50 and the interlayer insulating layer 30I.

The work function of the work function control layer 55 may be smaller than that of the control gate 50. As a result, it may be confirmed that in connection with the first electric field $E_1$ for forming the fixed charge region FC2, the diffusion range of the fringing electric field is further increased as compared with the first electric field $E_1$ due to the control gate 50 shown in FIG. 6A. By using the work function control layer 55, it may be easier to form a fixed charge region in the portion of the information storing layer 40 between the memory cells of the first electric field $E_1$.

Figure 8:
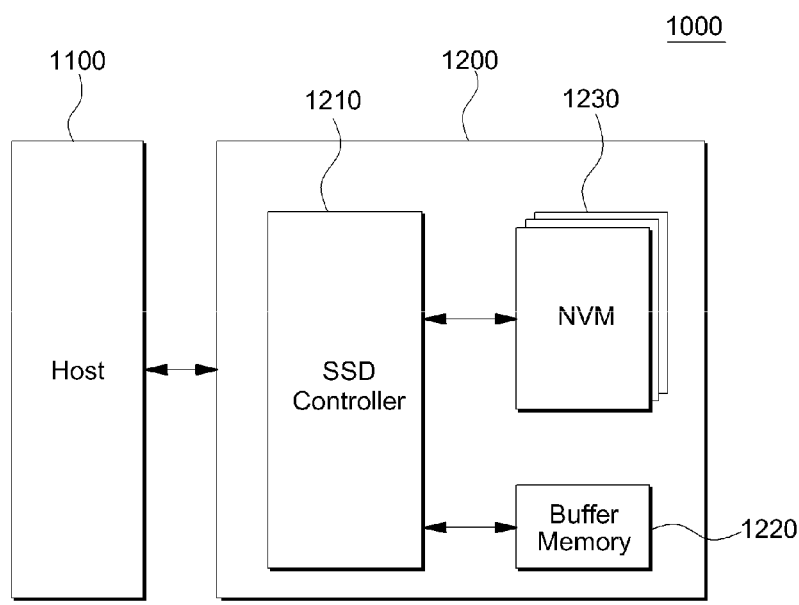
FIG. 8 is a block diagram illustrating a storage device including a solid-state disk according to an embodiment of the present disclosure.

FIG. 8 is a block diagram illustrating a storage device 1000 including a solid state disk (hereinafter, SSD) according to an embodiment of the present disclosure.

Referring to FIG. 8, the storage device 1000 includes a host 1100 and an SSD 1200. The SSD 1200 may include an SSD controller 1210, a buffer memory 1220, and a 3-dimensional NAND flash memory device 1230. The SSD controller 1210 provides electrical and physical connections between the host 1100 and the SSD 1200. In an embodiment, the SSD controller 1210 provides an interface for the SSD 1200 corresponding a bus format of the host 1100. In addition, the SSD controller 1210 may decode a command provided from the host 1100 and access the 3-dimensional NAND flash memory device 1230 according to the decoded result. As the non-limiting examples of the bus format of the host 1100, USB (Universal Serial Bus), SCSI (Small Computer System Interface), PCI express, ATA (Advanced Technology Attachment), PATA (Parallel ATA), SATA (Serial ATA), and SAS (Serial Attached SCSI) may be included.

The buffer memory 1220 may temporarily store write data provided from the host 1100 or data read from the 3-dimensional NAND flash memory device 1230. When data existing in the 3-dimensional NAND flash memory device 1230 is cached when the host 1100 requests a read operation, the buffer memory 1220 may be provided with a cache function which directly provides the cached data to the host 1100. In general, a data transfer speed by the bus format (e.g., SATA or SAS) of the host 1100 may be higher than a data transfer speed of a memory channel of the SSD 1200. In this case, a large-capacity buffer memory 1220 is provided to minimize performance degradation caused by a speed difference. The buffer memory 1220 for this may be a synchronous DRAM to provide sufficient buffering, but embodiments area not limited thereto.

The 3-dimensional NAND flash memory device 1230 may be provided as a storage medium of the SSD 1200. For example, the 3-dimensional NAND flash memory device 1230 may be a NAND-type flash memory having a large storage capacity according to the embodiments described above with reference to FIGS. 1 to 7B. In another example, as the 3-dimensional NAND flash memory device 1230, a memory system including a NOR flash memory, a phase change memory, a magnetic memory, a resistive memory, a ferroelectric memory, or different types of memory devices selected from among them may be applied.

Figure 9:
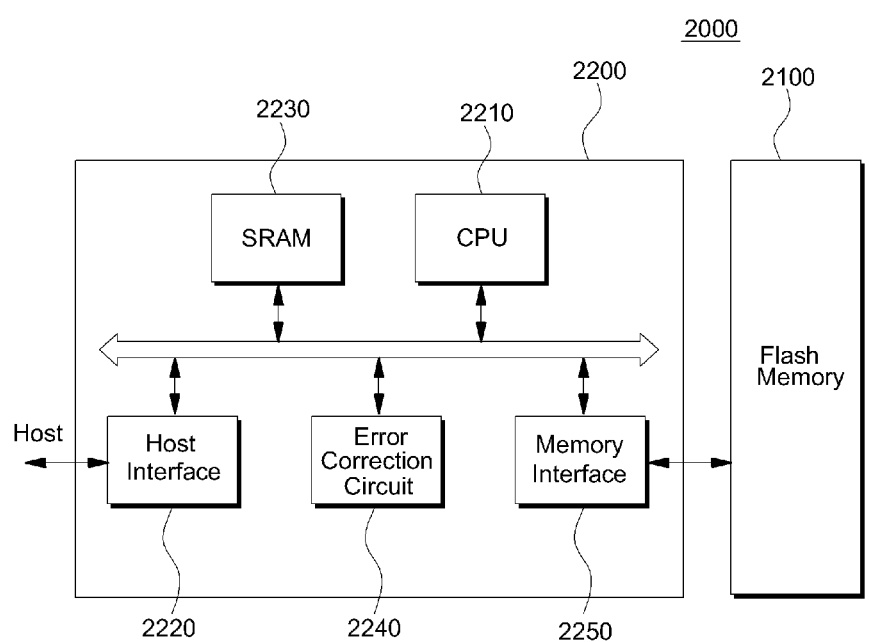
FIG. 9 is a block diagram illustrating a memory system according to an embodiment of the present disclosure.

FIG. 9 is a block diagram illustrating a memory system 2000 according to another embodiment of the present disclosure.

Referring to FIG. 9, the memory system 2000 may include a memory controller 2200 and a flash memory device 2100 that corresponds to the 3-dimensional NAND flash memory device described above with reference to FIGS. 1 to 7B. The flash memory device 2100 may detect memory cells having an abnormal speed when verifying target states, and thus may have high-speed and reliable program performance.

The memory controller 2200 may be configured to control the 3-dimensional NAND flash memory device 2100. An SRAM 2230 may be used as an operating memory of a CPU 2210. A host interface 2220 may implement a data exchange protocol of a host connected to the memory system 2000. An error correction circuit 2240 provided in the memory controller 2200 may detect and correct an error included in data read from the flash memory device 2100. A memory interface 2260 may interface with the flash memory device 2100. The CPU 2210 may perform various control operations for data exchange of the memory controller 2200. The memory system 2000 may further include a ROM (not shown) for storing code data for interfacing with the host.

The memory controller 2100 may be configured to communicate with an external circuit (for example, the host) through any one of various interface protocols such as USB, MMC, PCI-E, SAS, SATA, PATA, SCSI, ESDI, or IDE. The memory system 2000 may be applied to a computer, a portable computer, a UMPC (Ultra Mobile PC), a workstation, a net-book, a PDA, a portable computer, a web tablet, a wireless phone, a mobile phone, a smart phone, a digital camera, a digital audio recorder, a digital audio player, a digital picture recorder, a digital picture player, a digital video recorder, a digital video player, devices that may transmit and receive information in a wireless environment, and various user devices such as home networks.

A data storage device of the present invention may constitute a memory card device, an SSD device, a multimedia card device, an SD card, a memory stick device, a hard disk drive device, a hybrid drive device, or a general-purpose serial bus flash device. For example, the data storage device of the present invention may be a memory card that satisfies a standard or a specification for using an electronic device such as a digital camera, a personal computer, or the like.

A nonvolatile memory device and/or a memory controller according to the present invention may be mounted by using any of various types of packages. For example, the non-volatile memory device and/or the memory controller according to the present invention may be mounted by using any of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and so on.

The present invention described above is not limited to the above-described embodiments and the accompanying drawings, and it will be apparent to those having a common knowledge in a related field to which the present invention belongs, that various substitutions, modifications, and changes are possible within the scope of the technological spirit of the present invention.

What is claimed is:

1. A method of fabricating a 3-dimensional NAND flash memory device, the method comprising:
   providing a substrate;
   alternately and repeatedly stacking an insulating film and a first conductive film on the substrate;

forming first holes spaced apart from each other in a first direction and in a second direction crossing the first direction, the first and second directions being parallel to a top surface of the substrate, the first holes penetrating through the insulating film and the first conductive film which are repeatedly stacked, in a vertical direction perpendicular to the first and second directions;

forming a first fixed charge region on a sidewall of the insulating film exposed through the first holes;

forming an information storage film on inner sidewalls of holes penetrating through the insulating film including the first fixed charge region and the first conductive film; and forming a semiconductor channel layer on an exposed sidewall of the information storage film, wherein the alternately and repeatedly stacking the insulating film and the first conductive film further includes stacking a second conductive film having a work function smaller than that of the first conductive film between the insulating film and the first conductive film in the vertical direction, thereby forming a stack including a plurality of insulating films, a plurality of first conductive films, and a plurality of second conductive films, and wherein the second conductive film is disposed to contact each of top and bottom surfaces of each of the plurality of first conductive films.

2. The method of claim 1, wherein the forming of the first fixed charge region includes performing a hydrogen annealing on the sidewall of the insulating film exposed through the first holes in a hydrogen atmosphere.

3. The method of claim 1, wherein the forming of the first fixed charge region includes applying plasma damage to the sidewall of the insulating film exposed through the first holes.

4. A method of driving a 3-dimensional NAND flash memory device comprising a semiconductor channel layer vertically extending over a substrate; an information storage film vertically extending along a sidewall of the semiconductor channel layer; control gates surrounding at least a portion of the semiconductor channel layer with the information storage film that is disposed between the control gates and the semiconductor channel layer; and an interlayer insulating film separating the control gates from each other in a vertical direction perpendicular to a top surface of the substrate, the method comprising:

forming a fixed charge region in a portion of the information storage film under the control gates and a portion of the information storage film between the control gates by forming a first electric field between the control gates and the semiconductor channel layer; and eliminating the fixed charge region formed in the portion of the information storage film under the control gates by forming a second electric field having a polarity opposite to that of the first electric field and having a strength smaller than that of the first electric field between the control gates and the semiconductor channel layer, wherein, by the eliminating the fixed charge region formed in the portion of the information storage film under the control gates by forming the second electric field, fixed charges of the fixed charge region remain in the portion of the information storage film between the control gates, and the fixed charges remain in a charge trapping layer of the information storage film.

5. The method of claim 4, wherein at least one of the first electric field and the second electric field is formed by an incremental pulse programming method.

6. The method of claim 4, wherein the 3-dimensional NAND flash memory device further comprises a work function control layer disposed between the interlayer insulating film and each of the control gates in the vertical direction, the work function control layer having a work function that is smaller than that of the control gates.

7. The method of claim 6, wherein a thickness of the interlayer insulating film is greater than that of the control gates.

8. The method of claim 4, wherein the forming of the fixed charge region and the eliminating of the fixed charge region are repeatedly performed at least two or more times.

9. A method of driving a 3-dimensional NAND flash memory device comprising a semiconductor channel layer vertically extending over a substrate; an information storage film vertically extending along a sidewall of the semiconductor channel layer; control gates surrounding at least a portion of the semiconductor channel layer with the information storage film that is disposed between the control gates and the semiconductor channel layer; and an interlayer insulating film separating the control gates from each other in a vertical direction perpendicular to a top surface of the substrate, the method comprising:

forming a fixed charge region in a portion of the information storage film under the control gates and in a portion of the information storage film between the control gates by forming a first electric field between the control gates and the semiconductor channel layer; and eliminating the fixed charge region formed in the portion of the information storage film under the control gates by forming a second electric field having a polarity opposite to that of the first electric field and having a strength smaller than that of the first electric field between the control gates and the semiconductor channel layer, wherein the 3-dimensional NAND flash memory device further comprises a work function control layer disposed between the interlayer insulating film and each of the control gates in the vertical direction, the work function control layer having a work function that is smaller than that of the control gates, the work function control layer being disposed on sidewalls of the control gates, and wherein the work function control layer is disposed to contact each of top and bottom surfaces of each of the control gates.

* * * * *